Sept. 5, 1961 B. S. ROBERTSON, JR 2,999,212

FREQUENCY MODULATED OSCILLATOR

Filed March 15, 1956 2 Sheets-Sheet 1

$e_4 = K_1 (e_2 - e_3)$ $e_5 = K_2 (e_3 - e_2)$ $e_4 - e_5 = E_{R2} + E_{C2}$

INVENTOR

BEDFORD S. ROBERTSON, JR

BY G. W. O'Brien

Q. Baxter Warner

ATTORNEYS

Sept. 5, 1961 B. S. ROBERTSON, JR 2,999,212

FREQUENCY MODULATED OSCILLATOR

Filed March 15, 1956 2 Sheets-Sheet 2

INVENTOR
BEDFORD S. ROBERTSON, JR.

BY [signature]
[signature]
ATTORNEYS

United States Patent Office 2,999,212
Patented Sept. 5, 1961

2,999,212
FREQUENCY MODULATED OSCILLATOR

Bedford S. Robertson, Jr., Washington, D.C., assignor to the United States of America as represented by the Secretary of the Navy Filed Mar. 15, 1956, Ser. No. 571,849
8 Claims. (Cl. 332—29)

The present invention relates to a frequency modulated oscillator for use in guided missile simulators. More specifically, it relates to an electronic oscillator whose frequency of oscillation can be controlled by electrical means without thereby introducing objectionable variations in the amplitude of said oscillations.

The frequency modulated oscillator of the present invention is suitable for use in the simulator described in patent application Serial No. 557,813, filed January 6, 1956, for Simulated Missile Homing System by S. A. Jordan et al. The oscillators there required must be capable of wide frequency deviations from the center frequency. The deviations must occur linearly with control voltage changes, and at the same time there must result very little amplitude modulation. Moreover, the frequency must not drift from the value established by the control voltage for a time that would be equivalent to the duration of a missile flight.

Prior art phase shift oscillators comprise several resistance-capacity networks in series with provision for applying feedback to the network. The frequency of oscillation of a phase shift oscillator is controlled by varying the internal impedance of a vacuum tube which is connected in series with one of the resistance branches of the network. Phase shift oscillators possess several inherent qualities which result in frequency instability and the production of relatively large variations in the amplitude of the output when the control voltage is varied.

One object of this invention is to produce a frequency modulated oscillator having a very low frequency drift.

Another object of the invention is to produce an oscillator which will provide a substantially linear deviation in frequency without resulting amplitude modulation with changes in the control voltage.

Still another object of the present invention is to provide a frequency modulated oscillator operating in the audio range of frequencies which possesses the aforementioned qualities of freedom from drift and amplitude modulation.

Other objects and many of the attendant advantages of this invention will be readily appreciated as the same becomes better understood by reference to the following detailed description when considered in connection with the accompanying drawings, wherein.

Figure 1:
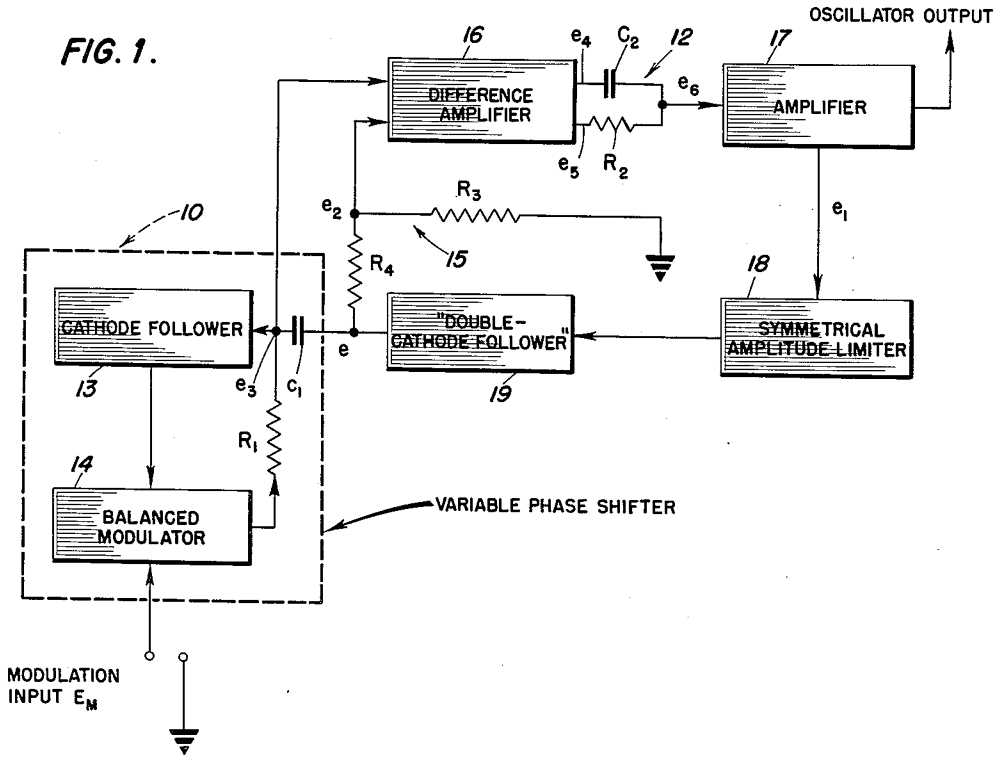
FIG. 1 is a block diagram of the oscillator.

A block diagram of the frequency modulated oscillator of the present invention appears in FIG. 1. The frequency determining elements comprise a variable phase shifter 10 and a fixed phase shift network 12. The variable phase shifter 10 includes a resistor $R_1$ and a capacitor $C_1$ together with a cathode follower 13 and a balanced modulator 14 arranged to form a feedback loop around resistor $R_1$. The gain of the balanced modulator 14 is controlled as a function of an external modulating voltage $E_M$, the source of which is not shown. The effect of a variation in gain of the balanced modulator is an apparent variation in the time constant of the phase shift network $R_1C_1$.

The fixed phase shifter 12 comprises a resistor $R_2$ and a capacitor $C_2$ connected in series. A voltage divider 15 and a difference amplifier 16 permits constant gain operation of phase shifters 10 and 12. As will be understood, the network 12 does not maintain constant phase output for varying input frequencies. It does however, possess a fixed time constant and therefore is to be differentiated from phase shifter 10.

Constant gain operation of the networks is of importance in minimizing the occurrence of amplitude modulation when the frequency of oscillation is shifted. Accordingly, the constant gain operation of the networks will be discussed in greater detail hereinafter with reference to FIG. 3.

The output of network 12 is amplified and shifted in phase 180° by an amplifier 17. The output voltage of the oscillator is taken from the output of the amplifier 17. A symmetrical amplitude limiter 18 receives the output of amplifier 17 and provides the input to the voltage feedback loop which includes the frequency determining elements of the oscillator.

Studies of prior oscillator circuits have shown that one source of frequency instability has been due to ineffective limiting means which are usually only those which may arise due to non-linearities in the characteristics of the associated vacuum tubes. Such limiting is harsh and usually results in clipping a portion of the oscillation. As a result of intermodulation of the harmonics returned through the phase shift networks to the point of non-linearity, a fundamental component not in phase with the original results. This causes a shift in phase of the resultant fundamental and the frequency of oscillation shifts to maintain the phase around the loop constant.

The limiter 18 has symmetrical characteristics for both positive and negative voltages, and thus the harmonics which are generated by its limiting action are predominantly odd harmonics. As a result, any fundamental component arising due to the presence of harmonics will be so small as to be ineffective in causing a frequency shift.

A double cathode follower 19 receives the output of the symmetrical amplitude limiter and provides a source of very low impedance for driving the variable phase shifter 10. The provision of a voltage source with sufficiently low internal impedance permits a wide variation of the impedance of phase shifter 10, without affecting the amplitude of the output of the voltage source.

Figure 2:
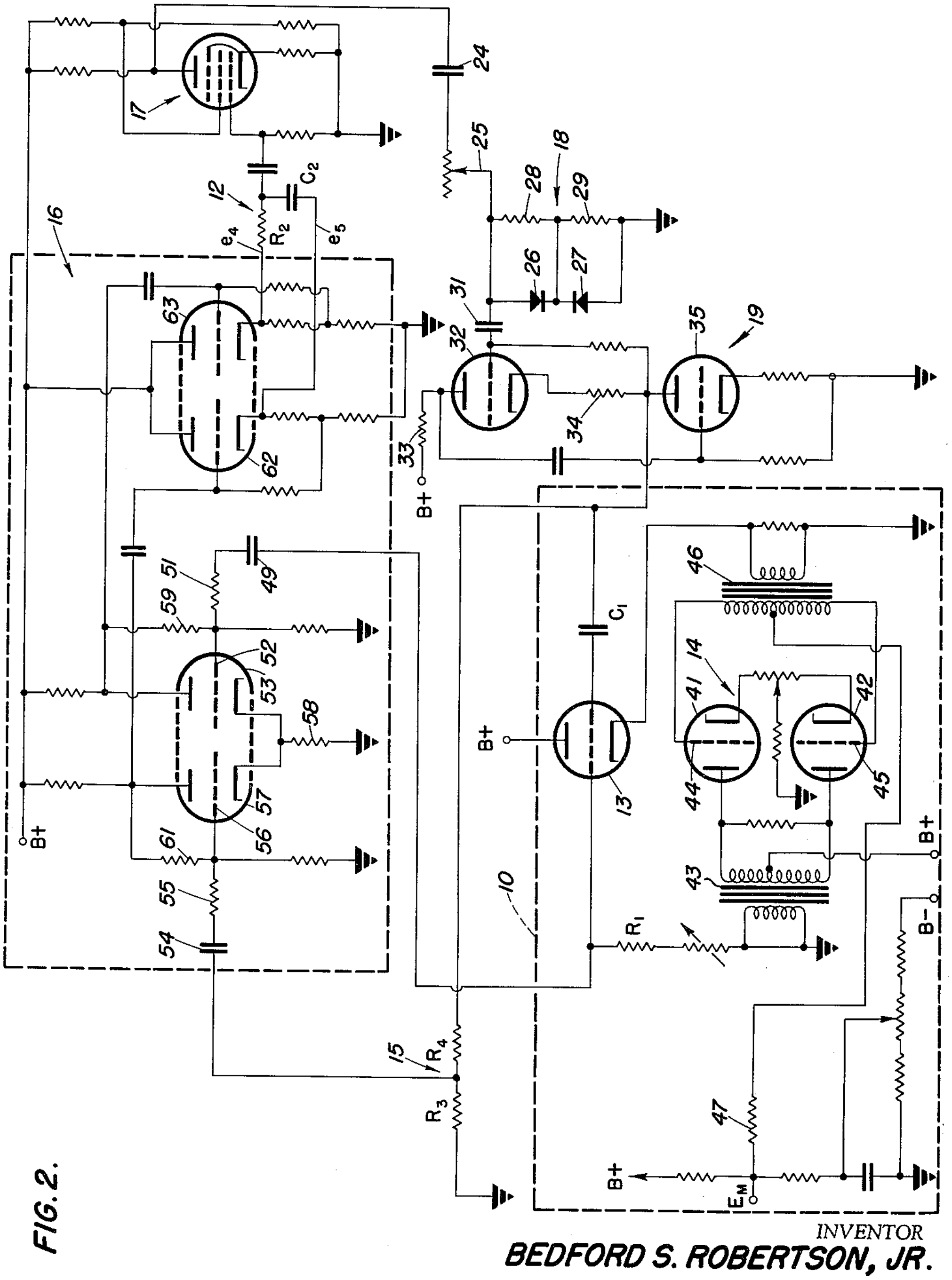
FIG. 2 is a schematic diagram of the oscillator.

In FIG. 2, the components represented by blocks in FIG. 1 are shown schematically. Commencing at pentode amplifier 17, the output of which constitutes the oscillator output, oscillations are applied through a coupling capacitor 24 and a variable resistor amplitude control 25 to a symmetrical amplitude limiter 18. Limiter 18 is composed of a pair of matched selenium diodes 26 and 27 connected back to back. The diodes 26 and 27 are each shunted by shaping resistors 28 and 29. The shaping resistors and the comparatively high forward resistance of the diodes 26 and 27 provide a limiting action characterized by the absence of sharp clipping.

The limited oscillations pass through a coupling capacitor 31 to the double cathode follower 19. Cathode follower 19 includes an input triode 32 receiving plate voltage through a load resistor 33. The cathode of triode 32 is connected through a cathode resistor 34 to the plate of a feedback triode 35. The input to triode 35 is the voltage at the plate of triode 32. The feedback obtained from triode 35 aids in providing an exceptionally low internal impedance voltage source for driving the available phase shifter 10 and the voltage divider 15.

The voltage at the junction of $R_1$ and $C_1$ is fed through cathode follower 13 into a balanced modulator 14 as the carrier signal. In the modulator 14, matched triodes 41 and 42 are connected in push-pull through a center tapped output transformer 43. The carrier signal is applied in phase opposition to the grids 44 and 45 of triodes 41 and 42 through a center tapped input transformer 46. The modulating voltage $E_M$ is applied through an isolating resistor 47 to the center tap of input transformer 46. The modulating voltage appears in phase at the grids of both triodes 41 and 42, and therefore, as the output depends upon the difference in the plate currents of triodes 41 and 42, the modulating voltage does not appear as a separate component in the oscillator output.

The voltage appearing at the junction of $R_1$ and $C_1$ is fed through a coupling capacitor 49 and isolating resistor 51 to the grid 52 of a triode 53, forming one half of the input section of difference amplifier 16. The voltage appearing at the junction of $R_3$ and $R_4$ in voltage divider 15 is passed through a coupling capacitor 54 and isolating resistor 55 to the grid 56 of a triode 57 forming the remaining half of the input section of difference amplifier 16. The input section is generally conventional in construction, including the usual common cathode resistor 58. Improved results are obtained, however, by the provision of feedback through resistors 59 and 61 to the grids 52 and 56 of triodes 53 and 57. The output voltages of the difference amplifier input section, found at the plates of triodes 53 and 57, are of equal magnitude and opposite phase. The difference voltages are each fed to cathode followers 62 and 63 which provide low impedance sources for driving the fixed phase shift network 12.

The oscillator loop is completed with the application of the voltage at the junction of resistor $R_2$ and capacitor $C_2$ to the grid of pentode amplifier 17.

Figure 3:
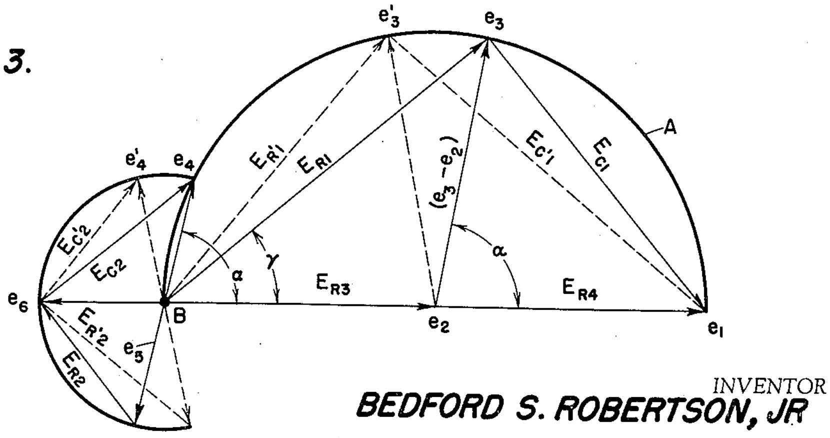
FIG. 3 is a vector diagram of the voltages within the oscillator.

The relationship of the various voltages appearing within the oscillator is shown in FIG. 3. The oscillator output voltage $e_1$ is chosen as a reference voltage. The output voltage is split into two equal in phase components $E_{R3}$, $E_{R4}$ by the voltage divider 15 shown in FIG. 1. The locus of the voltage $e_3$ appearing at the junction of resistor $R_1$ and capacitor $C_1$ is a semi-circular path A having $e_1$ as a diameter. The position of $e_3$ along the circumference depends upon the ratio of the reactance of $C_1$ to the resistance of $R_1$, with $e_3$ approaching $e_1$ as the ratio of reactance to resistance decreases.

The capacitive reactance of $C_1$ is a function of both the value of the capacitor $C_1$ and the frequency of the voltage applied to the network. It is evident that if the voltage $E_{C1}$ developed across the capacitor $C_1$ or the voltage $E_{R1}$ developed across the resistor $R_1$ were measured with respect to zero potential, point B, severe amplitude changes would be noted as either the capacity $C_1$ or the frequency of the applied voltage $e_1$ were changed. The obvious results of employing the variable voltages $E_{C1}$ and $E_{R1}$ as feedback voltages in a frequency modulated oscillator is the production of amplitude modulation in the output of the oscillator.

Amplitude variation of the resistive and capacitive voltage components, $E_{R1}$ and $E_{C1}$, is avoided by establishing the center of curvature of the semi-circle A using the voltage divider 15 in FIG. 1. The feedback voltage employed is then the voltage $e_3$ appearing at the junction of the resistor $R_1$ and the capacitor $C_1$ measured with respect to the center of curvature of the locus of $e_3$. It can be seen that the feedback voltage $(e_3-e_2)$ is a radius of the semi-circle A, and hence will undergo no change in amplitude as $e_3$ assumes various positions along its locus. The phase angle $\alpha$ of the voltage $(e_3-e_2)$ with respect to the voltage $e_1$ determines the frequency of oscillation, and inasmuch as the amplitude of the voltage $(e_3-e_2)$ is constant as $E_{R1}$ and $E_{C1}$ change, the combination of the voltage divider and the frequency determining network $R_1C_1$ provides a phase shifter with constant gain.

The difference amplifier 16 provides a voltage $e_4$ in phase with and proportional to the radius vector voltage $(e_3-e_2)$. The difference amplifier also provides a voltage $e_5$ which is 180° out of phase with $e_4$ but of the same magnitude as $e_4$. The difference amplifier therefore permits constant gain operation of the fixed phase shift network 12 by establishing the center of curvature of the locus of the voltage $(e_4-e_5)$ appearing thereacross.

The input to the amplifier 17 is the voltage $e_6$ appearing at the junction of the resistor $R_2$ and the capacitor $C_2$ of the fixed phase shift network 12. Since the output of the oscillator $e_1$ is the voltage $e_6$ magnified by the gain of the amplifier and shifted in phase by 180°, the voltage $e_6$ remains fixed in phase with respect to the output voltage $e_1$, whatever the position of $e_4$ and $e_5$ is along their locus. The sum of the voltage developed across the resistor $E_{R2}$ and the voltage developed across the capacitor $E_{C2}$ is equal to the total voltage $(e_4-e_5)$ applied to the network. The complete relationship of the voltages appears within the smaller semi-circle of FIG. 3.

If the voltage $e_3$ is shifted to a new position $e_3'$, by changing the ratio of the apparent reactance of the capacitor $C_1$ to the resistance of $R_1$, the outputs of the difference amplifier, $e_4$ and $e_5$, must change in phase an amount equal to the change in phase of $e_3$. The new positions of $e_4$ and $e_5$ are shown at $e_4'$ and $e_5'$. It will be remembered that the phase between the voltage $e_6$ and the voltage $e_1$ is fixed at 180°, therefore, it is obvious by FIG. 2, that the magnitudes of the resistive component $E_{R2}$ and the capacitive component $E_{C2}$ of the voltage applied to the fixed phase shifter must assume new values of $E_{R2}'$ and $E_{C2}'$, respectively. Since the magnitude of the voltage applied to the phase shifter is constant, the necessary changes in the magnitude of the component voltages can only occur by a variation in the ratio of the reactance of $C_2$ to the resistance of $R_2$. Since both the capacity of $C_2$ and the resistance of $R_2$ are fixed, the required change in the voltage components must be effected by a change in the frequency of oscillation to that value which will establish the proper ratio of reactance to resistance for the fixed phase shifter.

Inasmuch as the modulator gain is not a linear function, nor is it desired to be, it is well to consider the function necessary to provide linear frequency deviation.

Assuming for the moment that the modulator is removed from the oscillator circuit, the following expresses the oscillator frequency;

$$f=\frac{1}{2\pi\sqrt{R_1C_1R_2C_2\frac{1-K_1K_3(1-B_1)}{1-K_2K_3B_1}}} \tag{1}$$

where $K_1$ is the gain of difference amplifier 16 in providing voltage $e_4$, $K_2$ is the gain of difference amplifier 16 in providing voltage $e_5$, $K_3$ is the gain of amplifier 17, and $B_1$ is the ratio $$\frac{R_3}{R_3+R_4}$$

The gains $K_1$ and $K_2$ are made equal in the difference amplifier and because of the feedback provision they tend to remain thus. Also resistors $R_3$ and $R_4$ are made equal thereby providing $B_1=\frac{1}{2}$.

Equation 1 therefore reduces to $$f=\frac{1}{2\pi\sqrt{R_1C_1R_2C_2}} \tag{2}$$

Now replacing the modulator and assuming its gain to be $\mu$, the frequency of oscillation can be shown to be $$f=\frac{\sqrt{1-\mu}}{2\pi\sqrt{R_1C_1R_2C_2}} \tag{3}$$

From Equation 3 it can be shown that the modulator gain required to produce linear frequency deviation must vary with the modulating voltage $E_M$ according to the formula $$\mu=1-K(E_M+C)^2 \quad (4)$$

where K and C are constants depending upon circuit constants of the modulator and the modulation index desired.

Selection of the modulator components best suited to provide the necessary gain function is most easily done empirically, since an analytical approach is cumbersome. However, the modulator bias can be adjusted to provide a close approximation of the required gain function.

Obviously many modifications and variations of the present invention are possible in the light of the above teachings. It is therefore to be understood that within the scope of the appended claims the invention may be practiced otherwise than as specifically described.

What is claimed is:

1. A frequency modulated oscillator comprising, an amplifier, a variable phase shifter receiving the output of said amplifier, and providing a voltage shifted in phase with respect to said output, a voltage divider also receiving the output of said amplifier for establishing a reference voltage, a fixed phase shifter, means receiving the phase shifted output of said variable phase shifter and said reference voltage and providing equal and oppositely polarized output components for application to said fixed phase shifter, and means applying the output of said fixed phase shifter to the input of said amplifier in positive feedback relationship to the output thereof.

2. An oscillator as claimed in claim 1, wherein said variable phase shifter includes a balanced modulator for varying the time constant of said variable phase shifter as a function of an external modulating voltage.

3. An oscillator as claimed in claim 2, with additionally means for symmetrically limiting the output of said amplifier applied to said variable phase shifter and said voltage divider.

4. A frequency modulated oscillator comprising, an amplifier, a voltage divider receiving the output of said amplifier, a first phase shifter including a resistive element and a reactive element and having means for varying the time constant thereof connected in parallel with one of said elements, means providing a pair of oppositely phased output voltages each of which is proportional to the difference between the output of said voltage divider and the voltage at the junction of said resistive and reactive elements of said first phase shifter, a second phase shifter including a second resistive element and a second reactive element joined together, with each of said second elements receiving one of said pair of output voltages, and means applying the voltage at the junction of said second elements to the input of said amplifier in positive feedback relationship.

5. An oscillator as claimed in claim 4, wherein said means for varying the time constant of said first phase shifter comprises a balanced modulator said modulator being arranged to receive an external modulating voltage for varying the gain thereof.

6. An oscillator as claimed in claim 5, with additionally, means for symmetrically limiting the output of said amplifier applied to said voltage divider.

7. A frequency modulated oscillator comprising, an amplifier, a voltage divider including first and second resistors for reducing the magnitude of the output of said amplifier, a phase shifter including a first capacitor and a third resistor receiving the output of said amplifier, a modulator connected in the form of a feedback loop around said third resistor, means for controlling the gain of said modulator in accordance with an external modulating voltage, a difference amplifier providing a difference voltage output proportional to the difference between the reduced voltage output of said voltage divider and the voltage appearing across said third resistor of said phase shifter, means providing an inverted voltage opposite in phase to said difference voltage, a second phase shifter including a second capacitor and a fourth resistor connected in series, said difference voltage and said inverted voltage being impressed across said second phase shifter, and means applying the voltage at the junction of said second capacitor and said fourth resistor to the input of said amplifier in positive feedback relationship.

8. An oscillator as claimed in claim 7, wherein said first and second resistors are equal in value.

References Cited in the file of this patent

UNITED STATES PATENTS 2,442,138 Mann et al. ------------ May 25, 1948